US010530354B2

(12) United States Patent
Masuda et al.

(10) Patent No.: US 10,530,354 B2
(45) Date of Patent: Jan. 7, 2020

(54) INSULATED GATE SEMICONDUCTOR DEVICE AND METHOD FOR MANUFACTURING INSULATED GATE SEMICONDUCTOR DEVICE

(71) Applicant: FUJI ELECTRIC CO., LTD., Kawasaki (JP)

(72) Inventors: Shinichi Masuda, Matsumoto (JP); Shinichi Yoshiwatari, Matsumoto (JP); Kenichi Yoshida, Matsumoto (JP); Hiroshi Ishida, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/905,014

(22) Filed: Feb. 26, 2018

(65) Prior Publication Data

US 2018/0191337 A1 Jul. 5, 2018

Related U.S. Application Data

(63) Continuation of application No. PCT/JP2017/011840, filed on Mar. 23, 2017.

(30) Foreign Application Priority Data

May 19, 2016 (JP) .................................. 2016-100363

(51) Int. Cl.
*H01L 29/739* (2006.01)
*H03K 17/04* (2006.01)
(Continued)

(52) U.S. Cl.
CPC ..... *H03K 17/0406* (2013.01); *H01L 21/4846* (2013.01); *H01L 23/49838* (2013.01);
(Continued)

(58) Field of Classification Search
CPC ............ H03K 17/0406; H03K 17/0424; H01L 23/49838; H01L 21/4846; H01L 29/7395;
(Continued)

(56) References Cited

U.S. PATENT DOCUMENTS 9,331,572 B2    5/2016 Inada et al.
2010/0097105 A1*  4/2010 Morita ................ H01L 27/0605
                                                  327/109
(Continued)

FOREIGN PATENT DOCUMENTS

JP     2005-268649    9/2005
JP     2009-21345     1/2009
(Continued)

OTHER PUBLICATIONS

English Translation by WIPO of the International Preliminary Report on Patentability dated Nov. 29, 2018 in corresponding International Patent Application No. PCT/JP2017/011840.
(Continued)

*Primary Examiner* — Bitew A Dinke

(57) ABSTRACT

An insulating gate semiconductor device includes an insulating gate semiconductor element, an insulating circuit board, and a main-current path member. A main-current of the insulating gate semiconductor element flows toward a first external terminal in the main-current path member; and a gate-current path member, being patterned so as to have a linearly extending portion arranged in parallel to a linearly extending portion of the main-current path member in a planar pattern on the insulating circuit board, being provided to connect between a second external terminal and a gate electrode of the insulating gate semiconductor element. A current which is induced in the gate-current path member by mutual induction caused by a change in magnetic field implemented by the main-current is used for increasing the
(Continued)

gate-current in a turn-on period of the insulating gate semiconductor element.

8 Claims, 7 Drawing Sheets

(51) Int. Cl.
 *H01L 21/48* (2006.01)
 *H01L 23/498* (2006.01)
 *H01L 23/00* (2006.01)

(52) U.S. Cl.
 CPC .......... *H01L 29/7395* (2013.01); *H01L 24/48* (2013.01); *H01L 24/85* (2013.01); *H01L 2224/45124* (2013.01); *H01L 2224/48225* (2013.01)

(58) Field of Classification Search
 CPC ........... H01L 29/78; H01L 2924/13055; H01L 24/48; H01L 24/85; H01L 2224/45124; H01L 2224/48225; H02M 1/08
 See application file for complete search history.

(56) References Cited

U.S. PATENT DOCUMENTS

| | | | |
|---|---|---|---|
| 2011/0110068 A1* | 5/2011 | Hanaoka | H01L 29/7395 361/820 |
| 2011/0215746 A1* | 9/2011 | Ikoshi | H01L 24/06 318/400.27 |
| 2013/0001805 A1* | 1/2013 | Azuma | H01L 25/072 257/784 |
| 2014/0035656 A1* | 2/2014 | Takao | H03K 17/6871 327/432 |
| 2014/0118055 A1* | 5/2014 | Seok | H01L 24/06 327/432 |
| 2015/0014746 A1* | 1/2015 | Inada | H01L 29/41725 257/192 |
| 2015/0223339 A1 | 8/2015 | Nakamura et al. | |
| 2016/0056150 A1* | 2/2016 | Nagai | H03K 17/0822 257/76 |
| 2016/0294275 A1* | 10/2016 | Pronovost | H03K 17/166 |
| 2016/0351697 A1* | 12/2016 | Hartmann | H01L 23/645 |
| 2018/0247923 A1* | 8/2018 | Hartmann | H01L 24/48 |
| 2019/0058468 A1* | 2/2019 | Okayama | H03K 17/602 |

FOREIGN PATENT DOCUMENTS

| | | |
|---|---|---|
| WO | WO 2013/161138 A1 | 10/2013 |
| WO | WO 2014/061211 A1 | 4/2014 |

OTHER PUBLICATIONS

International Search Report dated Jun. 13, 2017 in corresponding International Patent Application No. PCT/JP2017/011840.

* cited by examiner

INSULATED GATE SEMICONDUCTOR DEVICE AND METHOD FOR MANUFACTURING INSULATED GATE SEMICONDUCTOR DEVICE

CROSS REFERENCE TO RELATED APPLICATIONS AND INCORPORATION BY REFERENCE

This application is a continuation of International Application No. PCT/JP2017/011840 filed on Mar. 23, 2017, and further claims benefit of priority under 35 USC 119 based on JP2016-100363 filed on May 19, 2016, the entire contents of which are incorporated by reference herein.

BACKGROUND OF THE INVENTION

1. Field of the Invention

The present invention relates to an insulating gate semiconductor device and a method for manufacturing the insulating gate semiconductor device.

2. Description of the Related Art

In the related art, an insulating gate semiconductor device such as an insulating gate bipolar transistor (IGBT) is used as a switching element used in a power conversion system or the like. In order to improve conversion efficiency, it is important to reduce switching loss of the insulating gate semiconductor device. As a technique for reducing the switching loss, for example, a method for increasing the speed of a turn-on operation has been proposed in WO 2013/161138 A.

However, even with the technique of WO 2013/161138 A, the increasing of the speed of the turn-on operation during switching is not able to be achieved sufficiently, and a further new technique capable of reducing the switching loss has been requested.

SUMMARY OF THE INVENTION

The present invention has been made in view of the above-mentioned problems and an object of the present invention is to provide an insulating gate semiconductor device which can increase a speed of a turn-on operation in a switching period and reduce switching loss, and a method for manufacturing the insulating gate semiconductor device.

In order to solve the above-mentioned problems, an aspect of an insulating gate semiconductor device according to the present invention includes: an insulating gate semiconductor element, being a semiconductor chip; an insulating circuit board, having a first external terminal and a second external terminal provided in a periphery of the insulating circuit board, the semiconductor chip is mounted on the insulating circuit board; a main-current path member, being patterned so as to have a linearly extending portion in a planar pattern on the insulating circuit board, being provided to connect between the first external terminal and a main electrode region of the insulating gate semiconductor element, and a main-current of the insulating gate semiconductor element flows toward the first external terminal in the main-current path member; and a gate-current path member, being patterned so as to have a linearly extending portion arranged in parallel to the linearly extending portion of the main-current path member in a planar pattern on the insulating circuit board, being provided to connect between the second external terminal and a gate electrode of the insulating gate semiconductor element, and a gate-current which controls the main-current flow in a direction opposite to the main-current in the portion arranged in parallel in the gate-current path member. A current which is induced in the gate-current path member by mutual induction caused by a change in magnetic field implemented by the main-current is used for increasing the gate-current in a turn-on period of the insulating gate semiconductor element.

According to another aspect of the present invention, an aspect of a method for manufacturing the insulating gate semiconductor device according to the present invention includes: preparing an insulating gate semiconductor element, being a semiconductor chip; patterning a main-current path member having a linearly extending portion in a planar pattern on the insulating circuit board and a gate-current path member having a linearly extending portion in parallel to the linearly extending portion of the main-current path member in a planar pattern; mounting the semiconductor chip on the insulating circuit board; connecting between the main-current path member and a main electrode region of the insulating gate semiconductor element; and connecting between the gate-current path member and a gate electrode of the insulating gate semiconductor element so that a gate-current which controls a main-current of the insulating gate semiconductor element flows in a direction opposite to the main-current.

BRIEF DESCRIPTION OF THE DRAWINGS

FIG. 6C schematically illustrates a cross-sectional diagram of the insulating gate semiconductor device and a gate driving circuit in order to clearly explain a connection relation with a semiconductor chip of the insulating gate semiconductor device.

DETAILED DESCRIPTION OF THE PREFERRED EMBODIMENTS

Figure 1:
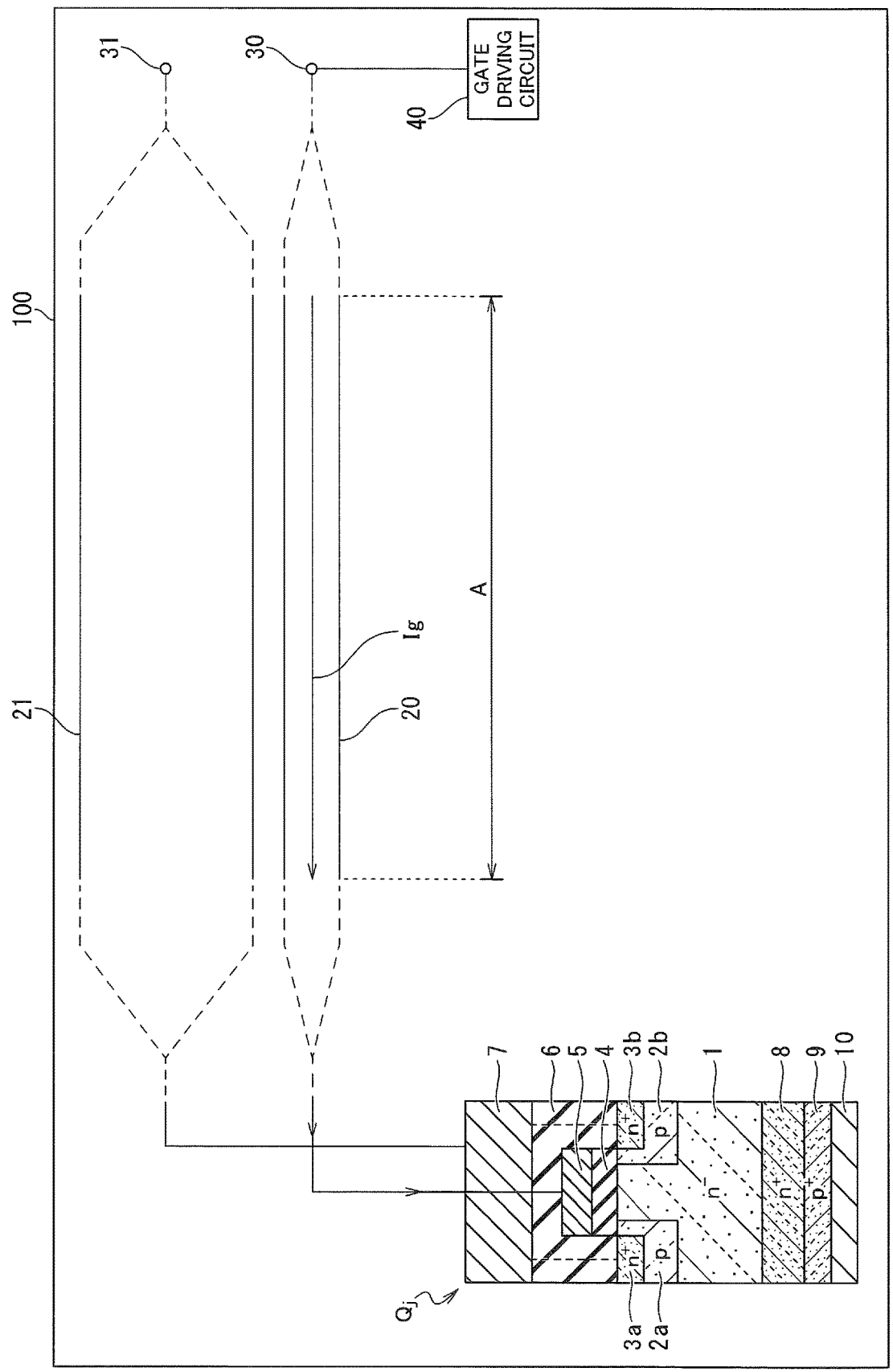
FIG. 1 is a block diagram including a cross-sectional diagram schematically illustrating an outline of a structure of an insulating gate semiconductor device according to an embodiment of the present invention.

Hereinafter, an embodiment of the present invention will be described. In the description of the following drawings, the same or similar portions are denoted by the same or similar reference numerals. However, the drawings are schematically illustrated and it is noted that, for example, the relationship between a thickness and plane dimensions and the thickness ratio of each device or each member are different from the actual relationship and the actual thickness ratio. Therefore, the detailed thickness or dimensions can be determined with reference to the following description. In addition, of course, the drawings include portions with different dimensional relationships or ratios.

In addition, in the following description, the "left-right" or "up-down" direction is simply defined for only convenience of explanation and does not limit the technical spirit of the present invention. Therefore, for example, when the plane of paper is rotated 90 degrees, the "left-right" direction and the "up-down" direction are switched. Of course, when the plane of paper is rotated 180 degrees, the "left" changes to the "right" and the "right" changes to the "left".

In addition, in the specification and the accompanying drawings, in regions or layers attached with n or p, it is denoted that electrons or holes are majority carriers, respectively. In addition, + or − attached to n or p denotes that the semiconductor region is relatively high or low in impurity concentration as compared with a semiconductor region to which + and − are not attached. However, even in the notation that illustrates the same concentration as $n^+$ and $n^+$, the notation is not limited to the case of having the same impurity concentration in practice.

(Mounting Structure)

As illustrated in FIG. 1, a mounting structure of the insulating gate semiconductor device according to an embodiment of the present invention includes an insulating gate semiconductor element which is configured to be semiconductor chips $Q_j$. The semiconductor chips $Q_j$ are implemented as one or more power switching elements. The semiconductor chip $Q_j$ is mounted on an insulating circuit board 100 which has high thermal conductivity.

The insulating circuit board 100 implements a package-board. "j" attached in the reference numeral "$Q_j$" takes values of one to n, j=1~n, and n is a positive number of one or more. In addition, FIG. 1 schematically illustrates a cross-sectional structure of main components of one semiconductor chip $Q_j$ among a plurality of power switching elements mounted on the insulating circuit board 100.

Each of the semiconductor chips is an IGBT including emitter regions 3a, 3b served as a first main electrode region, and a collector region 9 served as a second main electrode region provided to be separated from the emitter regions 3a, 3b. In the IGBT, the gate electrode 5 is disposed on the gate insulating film 4, which is provided close to the emitter regions 3a, 3b. A main-current flowing between the emitter regions 3a, 3b and the collector region 9 is controlled by a control signal which is transmitted to the gate electrode 5.

In addition, the insulating gate semiconductor device according to the embodiment of the present invention includes a first external terminal 31 provided outside a region in which a plurality of semiconductor chips $Q_j$ are arranged. A main-current path member 21, which is extending linearly in a planar pattern, is disposed as a conductive wiring on the insulating circuit board 100 between the first external terminal 31 and the emitter regions 3a, 3b.

The main-current path member 21 is provided and has a certain wiring line-length in order to electrically connects between the first external terminal 31 served as an external output terminal and each of the plurality of emitter regions 3a, 3b provided in each of the plurality of semiconductor chips $Q_j$ in parallel at a plurality of connecting sites. In the main-current path member 21, a main-current assembled from each of the emitter electrodes 7 of the plurality of semiconductor chips $Q_j$ to implement a large amount of current flows toward the first external terminal 31.

In addition, the insulating gate semiconductor device according to the embodiment of the present invention includes a second external terminal 30 which is provided outside a region in which a plurality of semiconductor chips $Q_j$ are arranged and the second external terminal 30 is connected to the gate driving circuit 40. A gate-current path member 20 is extending linearly in a planar pattern in parallel to the main-current path member 21, and is arranged as a conductive wiring on the insulating circuit board 100 between the second external terminal 30 and a gate electrode 5 of each of the plurality of semiconductor chips $Q_j$.

The gate driving circuit 40 generates a gate-current Ig as a control signal to control switching of an electrical conducting state of the main-current of each of the plurality of semiconductor chips $Q_j$, and transmits the gate-current Ig to the respective gate electrodes 5 of the plurality of semiconductor chips $Q_j$. Since the gate driving circuit 40 is electrically connected to the plurality of semiconductor chips $Q_j$ in parallel at the plurality of connecting sites through the second external terminal 30, the gate-current path member 20 is provided to have a fixed wiring line-length.

For example, the gate-current path member 20 is connected to each of the gate electrodes 5 of the plurality of semiconductor chips $Q_j$ by use of bonding wires or the like, so that each of the gate electrodes 5 of the plurality of semiconductor chips $Q_j$ is electrically connected to the gate driving circuit 40. In the gate-current path member 20, the gate-current Ig flows in a direction opposite to the flowing direction of the main-current.

In addition, the semiconductor chip $Q_j$ includes an $n^−$ type drift region 1 and a plurality of p-type base regions 2a, 2b selectively provided inside the drift region 1. The plurality of $n^+$ type emitter regions 3a, 3b are selectively provided inside the plurality of base regions 2a, 2b.

The gate electrode 5 is provided on a top surface of the drift region 1, bridging over the plurality of base regions 2a, 2b. An interlayer dielectric 6 is laminated on the surface of the gate electrode 5, and an emitter electrode 7 is laminated on the interlayer dielectric 6. As schematically illustrated by broken lines delineated inside the interlayer dielectric 6 in FIG. 1, the emitter electrode 7 is electrically connected to the emitter regions 3a, 3b through vias or the like.

On a top surface of the emitter electrode 7, a passivation layer or the like can be deposited as an outermost layer, although the illustration of the passivation layer in the drawing is omitted. An n$^+$ type buffer layer 8 is provided on a bottom surface of the drift region 1 which is located on the side opposite to the emitter electrode 7 of the drift region 1, and a p$^+$ type collector region 9 is provided on a bottom surface of the buffer layer 8. A collector electrode 10 is provided on a bottom surface of the collector region 9 and is electrically connected to the collector region 9.

An interval between the main-current path member 21 and the gate-current path member 20 is designed to be as shortened as possible by being set to a minimum length by which necessities occurring in manufacturing or usage are taken into consideration, and the gate-current path member 20 is arranged immediately adjacent in the vicinity of the main-current path member 21. In the insulating gate semiconductor device according to the embodiment of the present invention, it is preferable that a wiring pattern or an electrode pattern of the main-current path member 21 and the gate-current path member 20 is implemented in order to take advantage of the parasitic inductance actively.

The main-current path member 21 and the gate-current path member 20 which are served as a wiring pattern can be implemented, for example, in a form of a printed wiring or the like, the printed wiring can be manufactured by processing a shape of a copper foil etc. which is provided on the insulating circuit board 100. Specifically, the main-current path member 21 and the gate-current path member 20 can be manufactured by processing the copper foil etc. into patterns which are linear-shaped in a planar pattern and are in parallel to each other.

Otherwise, by connecting the printed wirings each other with connecting members which is bonding wires or the like of aluminum (Al) etc., the main-current path member 21 and the gate-current path member 20 can be realized in a complicated structure, for example, a copper foil-wire-copper foil. Even a complicated structure can be used as long as a series of shapes in a planar pattern are linear and conductivity is achieved.

By arranging the linear-shaped main-current path member 21 and the linear-shaped gate-current path member 20 to be in parallel to each other, a circular magnetic flux caused by the main-current centered on the main-current path member 21 is interlinked to the gate-current path member 20. The gate-current path member 20 is interlinked to the magnetic flux at the position closest to the main-current Ic on the insulating circuit board 100.

Figure 2:
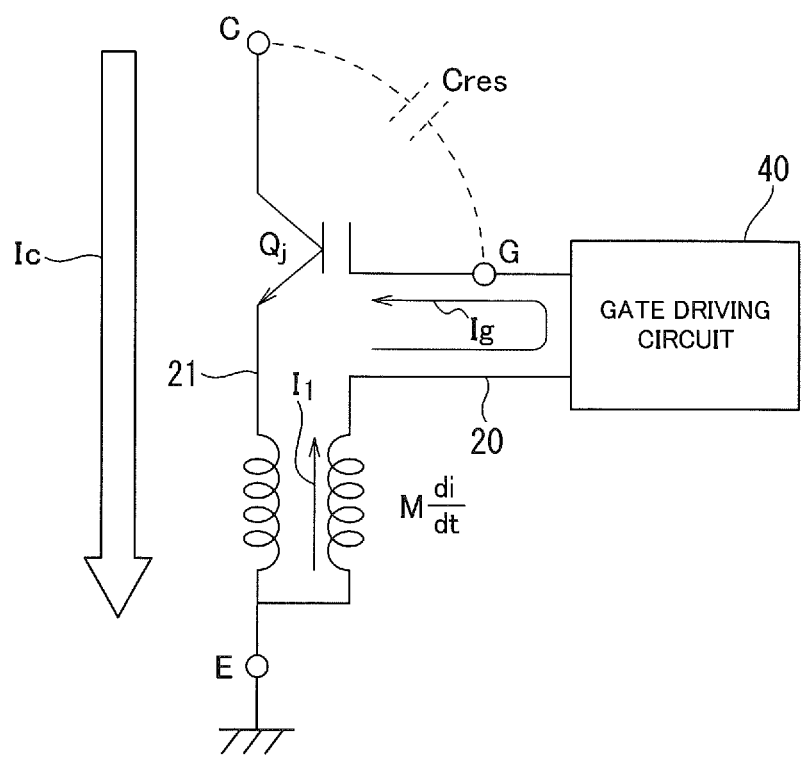
FIG. 2 is an equivalent circuit diagram of the insulating gate semiconductor device illustrated in FIG. 1.

In the insulating gate semiconductor device according to the embodiment of the present invention, a region in which the linear-shaped main-current path member 21 and the linear-shaped gate-current path member 20 are arranged in parallel to each other is defined as a "gate-current enhancing region A". In the gate-current enhancing region A, due to the operation of mutual induction caused by the main-current Ic which starts to flow abruptly at a timing of switching from the turn-off state to the turn-on state, an electromotive force M(di/dt) in the direction opposite to the main-current Ic occurs in the gate-current path member 20, as illustrated in FIG. 2. M is a coefficient of mutual induction.

Figure 3:
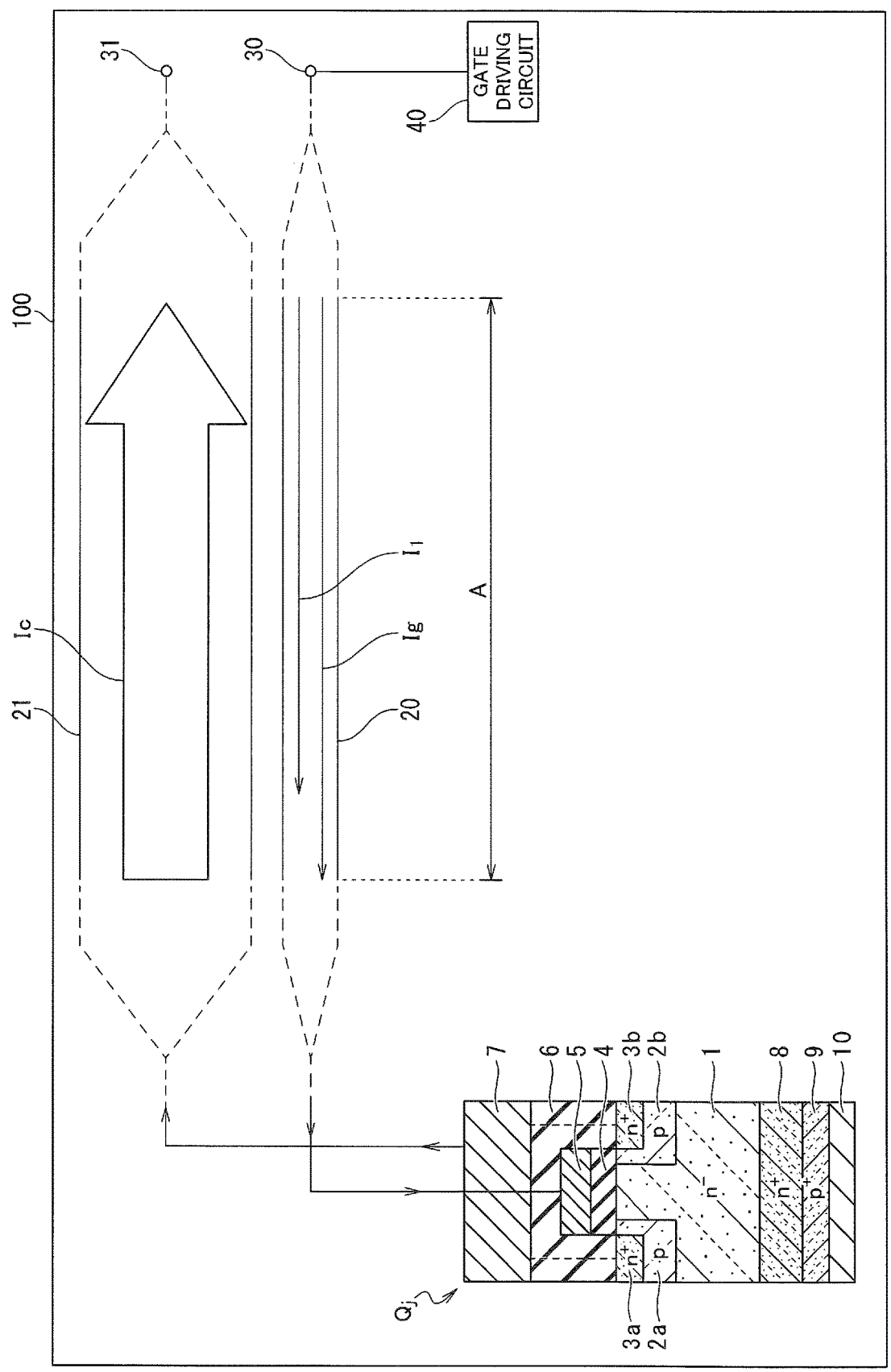
FIG. 3 is a block diagram including a cross-sectional diagram schematically illustrating a state when a main-current begins to flow in the insulating gate semiconductor device according to the embodiment of the present invention.

In the mount pattern in which the main-current path member 21 and the gate-current path member 20 are arranged linearly in parallel, as illustrated on the upper side of the gate-current path member 20 in FIG. 3, the induced current I$_1$ flowed by the electromotive force M(di/dt) is aligned in the same direction as the gate-current Ig. By the mount pattern in which the flow of the main-current Ic and the flow of the gate-current Ig are opposite to each other, the gate-current Ig is enhanced so as to be increased by the induced current I$_1$. The gate-current Ig is transmitted into the gate electrode 5 of the semiconductor chip Q$_j$.

At this time, in the case of the emitter-grounded IGBT exemplified in FIG. 2, discharging of the electric charges, which are accumulated in the feedback capacity C$_{res}$ exemplified by the broken line between the gate terminal G and the collector terminal C, is accelerated. The feedback capacity C$_{res}$ is one of the factors for delaying the turn-on operation of the insulating gate semiconductor device.

Since the magnetic field implemented by the linear current is proportional to the current value according to Bio-Savart's law, in the case of a power semiconductor device in which a large amount of current, for example, about 600 A or more, is handled, the parasitic inductance is very large. Therefore, in the case of a power semiconductor device with large rating capacity for handling a large amount of current, the turn-on operation due to the feedback capacity C$_{res}$ is delayed.

However, according to the structure of the insulating gate semiconductor device according to the embodiment of the present invention, it is possible to accelerate the turn-on operation of the power semiconductor device by using the parasitic inductance actively. That is, as the current becomes larger, the effectiveness of enhancing the gate-current Ig due to the parasitic inductance becomes more remarkable.

Next, changes in the control signal flowing into the gate electrode 5, the main-current Ic and the collector-emitter voltage Vce in the insulating gate semiconductor device according to the embodiment of the present invention and the insulating gate semiconductor device according to Comparative Example, will be described, through comparing FIG. 4 with FIG. 5. In addition, the time lengths indicated by the unit widths on the time axis illustrated in the horizontal axis in FIG. 4 and FIG. 5 are expressed so as to have the same value for comparison.

As compared with the insulating gate semiconductor device illustrated in FIG. 3, in the insulating gate semiconductor device according to Comparative Example which does not enhance the gate-current Ig, the gate-current path member 20 is arranged to be separated from the main-current path member 21 significantly. For example, an auxiliary wiring or the like is provided between the gate-current path member 20 and the main-current path member 21 so as to output the main-current Ic to the outside through another path.

According to Bio-Savart's law, the strength of the magnetic field implemented by the linear current is inversely proportional to the square of the radial distance from the linear current, so that the mutual inductance decreases, as the distance between the gate-current path member 20 and the main-current path member 21 increases. Therefore, as illustrated in FIG. 5A, in Comparative Example, enhancement of the gate-current Ig due to the operation of mutual induction caused by the change in the main-current Ic is implemented in small degree.

Figure 4A:
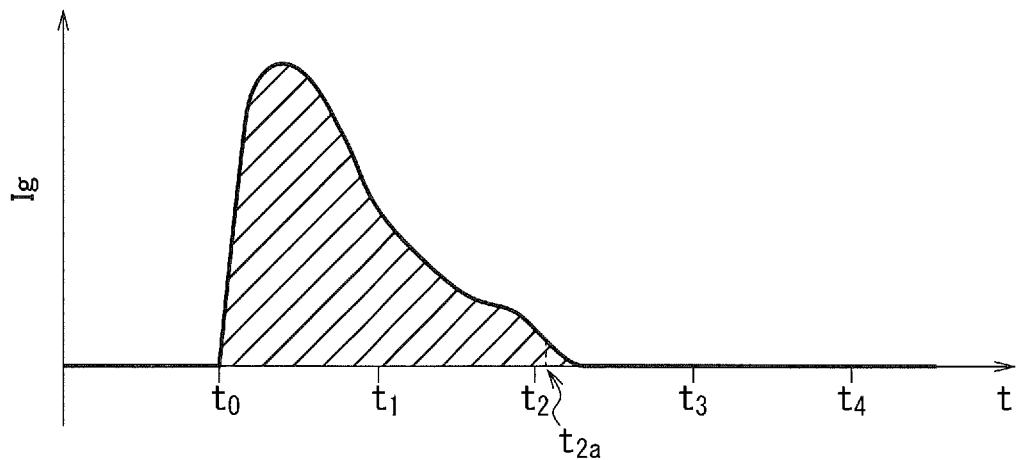
FIG. 4A is a graph illustrating a change in gate-current in a turn-on period when the insulating gate semiconductor device according to the embodiment of the present invention which is an IGBT is switched.
Figure 4B:
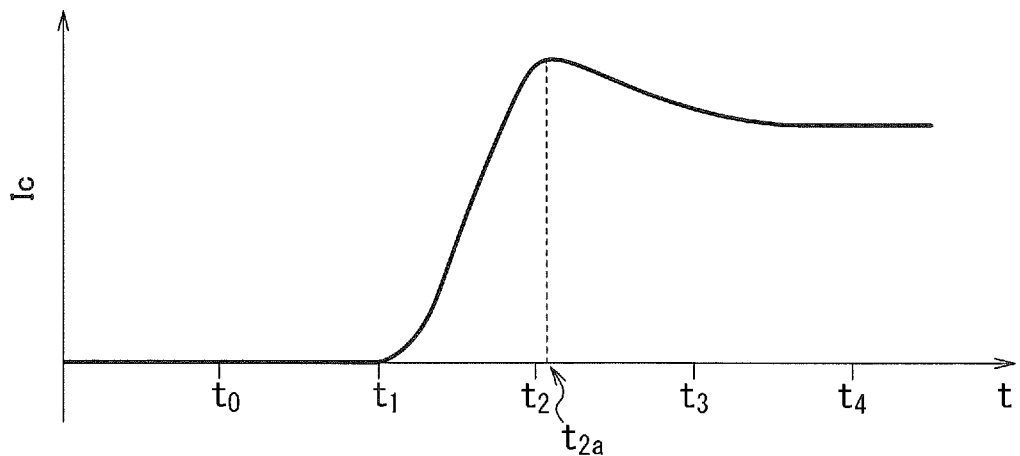
FIG. 4B is a graph illustrating a change in main-current of the IGBT in the turn-on period of the insulating gate semiconductor device according to the embodiment of the present invention.

In the case of the insulating gate semiconductor device according to the embodiment of the present invention, as illustrated in FIG. 4A, due to the gate-current Ig starting to flow from the time t=t$_0$, the semiconductor chip Q$_j$ turns on at the time t=t$_1$ as illustrated in FIG. 4B. Then, abruptly the main-current Ic starts to flow in the main-current path member 21. By the rapid time change (di/dt) of the main-current Ic which is a linear current, the magnetic flux implemented around the main-current path member 21 is interlinked to the gate-current path member 20 in the gate-current enhancing region A which is arranged in parallel and close to the main-current path member 21. By the interlinkage, an induced current $I_1$ occurs in the gate-current path member 20. Due to the enhancing the gate-current Ig by applying the induced current $I_1$, electric charges are accumulated more quickly in the gate electrode 5 of the semiconductor chip $Q_j$ than the case that enhancing is not executed.

Figure 4C:
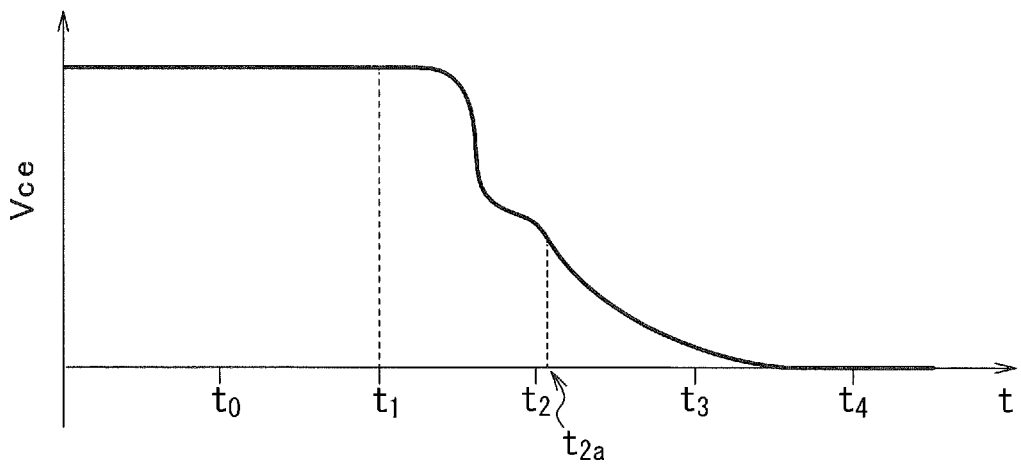
FIG. 4C is a graph illustrating a change in collector-emitter voltage of the IGBT in the turn-on period of the insulating gate semiconductor device according to the embodiment of the present invention.

As illustrated in FIG. 4B, the main-current Ic begins to flow at the time $t=t_1$, turn-on state begins. As exemplified in FIG. 4A, a waveform of the control signal after the time $t=t_1$, at which the turn-on state has begun, has a more gentle slope of descending as a waveform before time $t=t_1$. Therefore, a period at which the gate-current Ig descends to zero (0) level is shortened, and the timing at which the collector-emitter voltage Vce drops to zero (0) level comes earlier. As illustrated in FIG. 4C, in the case of the insulating gate semiconductor device according to the embodiment of the present invention, the value of the collector-emitter voltage Vce becomes very small around the time of passing $t=t_3$, and reaches zero before the time $t=t_4$.

Figure 5A:
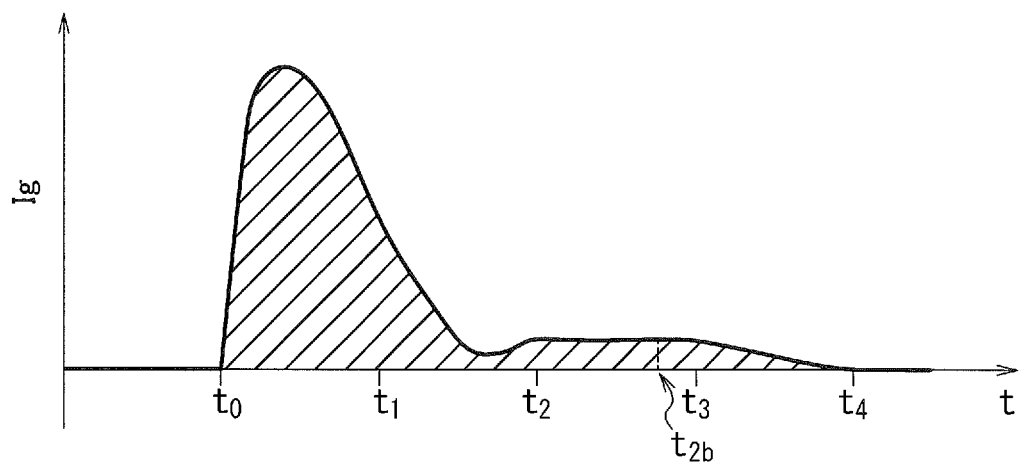
FIG. 5A is a graph illustrating a change in gate-current in a turn-on period when an insulating gate semiconductor device according to Comparative Example which is an IGBT is switched.
Figure 5B:
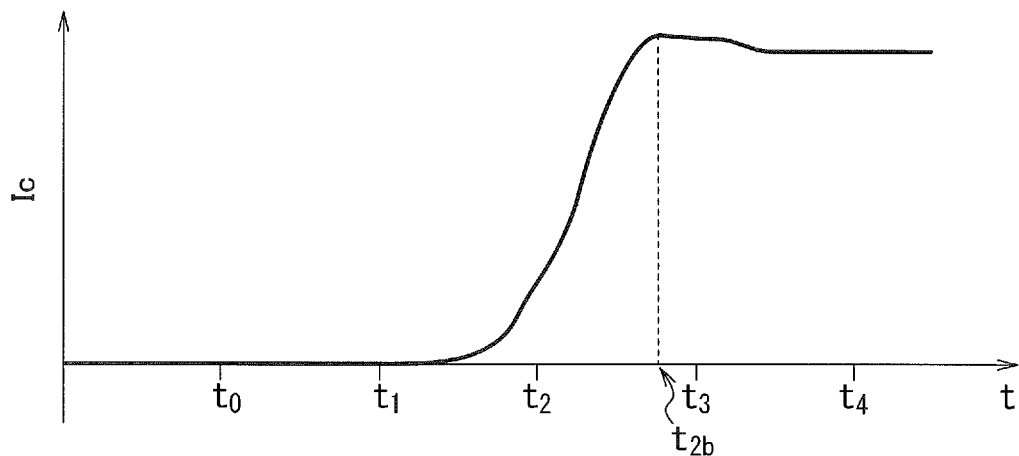
FIG. 5B is a graph illustrating a change in main-current of the IGBT in the turn-on period of the insulating gate semiconductor device according to Comparative Example.
Figure 5C:
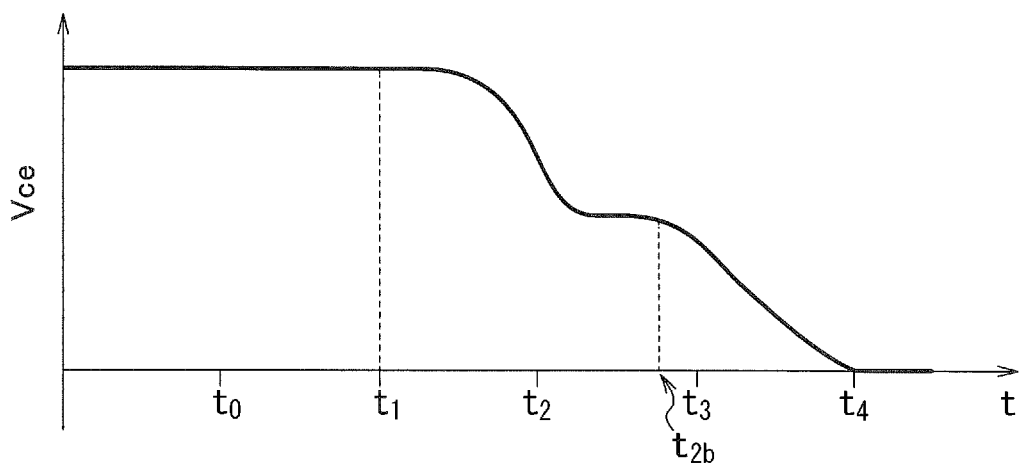
FIG. 5C is a graph illustrating a change in collector-emitter voltage of the IGBT in the turn-on period of the insulating gate semiconductor device according to Comparative Example.

On the other hand, in the case of Comparative Example in which the gate-current Ig is not enhanced, as exemplified in FIG. 5A, the gate-current Ig starts to flow from the time $t=t_0$, same as the case that the gate-current Ig is enhanced. However, a longer time is needed for the gate-current Ig to reach the zero level than the case in which the gate-current Ig is enhanced in FIG. 4A, although the main-current Ic starts to flow at the time $t=t_1$ and the turn-on state begins. As illustrated in FIG. 5C, in the case of the insulating gate semiconductor device according to Comparative Example, the value of the collector-emitter voltage Vce is considerably large even after the time of passing $t=t_3$, and reaches zero at the time $t=t_4$ finally.

Hereinafter, the turn-on operation in the case that the gate-current Ig is enhanced and the turn-on operation in the case that the gate-current is not enhanced will be described in more detail. In the case that the gate-current Ig is enhanced, the inflow of the control signal into the gate electrode 5 is reinforced. Therefore, the main-current Ic reaches the peak value faster than the case that the gate-current Ig is not enhanced illustrated in FIG. 5B, and a quick turn-on operation is achieved as illustrated in FIG. 4B. In FIG. 4B, a case is exemplified that the main-current Ic reaches the peak value at the time $t=t_{2a}$ closer to the time $t=t_2$ and, afterwards, is shifted to the steady turn-on state. As illustrated in FIG. 4C, the collector-emitter voltage Vce in the case that the gate-current Ig is enhanced drops rapidly in response to the change of the main-current Ic after the time $t=t_{2a}$, and the turn-on operation is finished.

On the other hand, in the case of Comparative Example in which the gate-current Ig is not enhanced, as compared with the case that the gate-current Ig is enhanced in FIG. 4B, the timing at which the main-current Ic reaches the peak value is delayed, and the turn-on operation takes more time. In FIG. 5B, the case is exemplified that the main-current Ic reaches the peak value at the time $t=t_{2b}$ closer to the time $t=t_3$ later than the time $t=t_{2a}$ corresponding to the peak value in FIG. 4B and, afterwards, is shifted to the steady turn-on state. $t_{2a}$ is smaller than $t_{2b}$, $t_{2a} < t_{2b}$. In addition, as illustrated in FIG. 5C, since the collector-emitter voltage Vce in the case that the gate-current Ig is not enhanced also takes time to drop according to the change in the main-current Ic in which the timing when the collector-emitter voltage Vce reaches the peak value is late, the turn-on time of the IGBT becomes longer.

In FIGS. 4A and 5A, integration values of current values of the control signals corresponding to the amount of electric charges discharged by the feedback capacity $C_{res}$ are exemplified by the areas of the regions which are illustrated in hatched line, respectively. The area hatched in FIG. 4A is equal to the area hatched in FIG. 5A. In the case of the insulating gate semiconductor device according to the embodiment of the present invention, the current value of the control signal, which is transmitted to the gate electrode 5, is represented by "$Ig+I_1$". In addition, the current value of the control signal of the insulating gate semiconductor device according to Comparative Example is represented by "Ig".

As can be seen from each shape of the regions with the areas illustrated in FIG. 4A and FIG. 5A, the gate-current Ig of the insulating gate semiconductor device according to the embodiment of the present invention quickly descends to zero (0) level because the induced current $I_1$ is added. Therefore, the turn-on time of the IGBT can be shortened.

Due to the insulating gate semiconductor device according to the embodiment of the present invention, a layout of a planar pattern, in which the gate-current path member 20 is in parallel and close to the main-current path member 21 and the gate-current Ig flows in the direction opposite to the main-current Ic, is implemented. And the mount pattern is implemented so as to align the direction of the induced current $I_1$ which is caused by the change in the main-current Ic flowing through the main-current path member 21, with the direction of the gate-current Ig flowing through the gate-current path member 20. Therefore, the utilization of the operation of mutual induction is maximized so that the gate-current Ig is enhanced. In this manner, by actively utilizing the parasitic inductance which has been considered to be excluded in the related art, the insulating gate semiconductor device turns on much faster than the insulating gate semiconductor device in the related art, so that it is possible to greatly reduce the switching loss.

That is, in the related art, the parasitic inductance has been designed to be as small as possible because the parasitic inductance in the mounting structure not only reduces the switching speed but also causes destruction of the power semiconductor element. Therefore, each path is provided so that the flowing direction of the main-current Ic and the flowing direction of the gate-current Ig are perpendicular to each other as much as possible, and the length of the intersection is as short as possible. And the mutual inductance has been designed so as to be as small as possible. Alternatively, the path of the gate-current Ig is arranged so as to be separated from the path of the main-current Ic as far as possible, and the mutual inductance existing parasitically has been designed to be as small as possible. In this manner, the main idea is that the mutual induction due to the parasitic inductance in the mounting structure exerts a negative influence on the switching operation, and on the contrary, an idea to control the mutual induction has not existed.

However, in the insulating gate semiconductor device according to the embodiment of the present invention, the main-current path member 21 and the gate-current path members 20 are arranged in parallel and close to each other so as to utilize the operation of mutual induction caused by the change in the main-current Ic, for enhancing the gate-current Ig. Therefore, as compared with the case that the main-current path member 21 and the gate-current path member 20 are arranged to be perpendicular to each other or arranged to be separated from each other as far as possible, a large space on the layout can be saved. Therefore, for example, in the case of determining the layout of the circuit patterns inside a package in which the semiconductor chips $Q_j$ are mounted on the circuit patterns when the main-current path member 21 and the gate-current path member 20 are circuit patterns in a semiconductor module, the present invention is very effective.

In general, the outer dimensions of the insulating circuit board 100 which is the main body of the package, and the positions of the input/output terminals, the auxiliary terminals, and the like in the peripheral region of the insulating circuit board 100, are standardized. Therefore, compatibility is maintained in many cases even if manufacturers are different. On the other hand, in the region inside the insulating circuit board 100, the circuit patterns to be implemented and the mounting positions themselves of the semiconductor chips $Q_j$ can be arbitrarily selected and designed. However, since the specification of the outer peripheral region is set to be substantially constant, there is an upper limit to the area of the portion which can be used for providing the circuit patterns.

When the rated current capacity of the insulating gate semiconductor device is to be increased, in accordance with Bio-Savart's law, as the main-current Ic is increased, variation in the magnetic flux density and the magnetic field, which are accompanied with the change in the main-current Ic in the turn-on period, is also increased. When the wiring which is served as the main-current path member 21 and the wiring which is served as the gate-current path member 20 are arranged to be separated from each other as far as possible in a layout by using the existing standardized package in order to avoid the variation, since an upper limit to the area of the designable area inside the insulating circuit board 100 exists, the wirings cannot be sufficiently separated from each other in the layout. In addition, even in the case of a layout in which the wirings are arranged to be perpendicular to each other, for example, when the number of semiconductor chips $Q_j$ to be mounted increases and the ratio of the area of the entire semiconductor chips $Q_j$ to the region inside the insulating circuit board 100 increases, for example, necessity to extend the wirings occurs and the necessity has difficulty to be responded to.

Here, due to the insulating gate semiconductor device according to the embodiment of the present invention, since a large space on the layout can be saved, it is possible to manufacture a package of an insulating gate semiconductor device in which switching loss is reduced, even if the existing standardized insulating circuit board 100 is used. Therefore, it is unnecessary to design and develop a new package, and it is excellent in cost performance.

In addition, due to the insulating gate semiconductor device according to the embodiment of the present invention, the gate-current path member 20 is arranged immediately in the vicinity of the main-current path member 21, and density of the interlinking magnetic flux is large. Therefore, it is possible to maximize the utilization of the operation of mutual induction caused by the change in the main-current Ic.

In addition, when the insulating gate semiconductor device according to the embodiment of the present invention is applied to a power semiconductor device with a large current capacity in which a value of a feedback capacity is increased, so that high speed operation and reduction of the switching loss in the gate driving of the power semiconductor device are compatible with each other. In addition, while suppressing excessive heat generation, a large amount of current can flow. In addition, since the speed of the turn-on operation can be increased, it is possible to improve the output of the power semiconductor device or to improve the waveform of the power semiconductor device.

(Manufacturing Method)

Next, a method for manufacturing the insulating gate semiconductor device according to the embodiment of the present invention illustrated in FIG. 1 will be described while exemplifying the case that the main-current path member 21 and the gate-current path member 20 are circuit patterns in a semiconductor module. The method for manufacturing the insulating gate semiconductor device described below is merely an example, and of course, the method can be realized by various manufacturing methods including the modified example other than the method as long as the method is within the scope of the spirit disclosed in the claims.

Figure 6A:
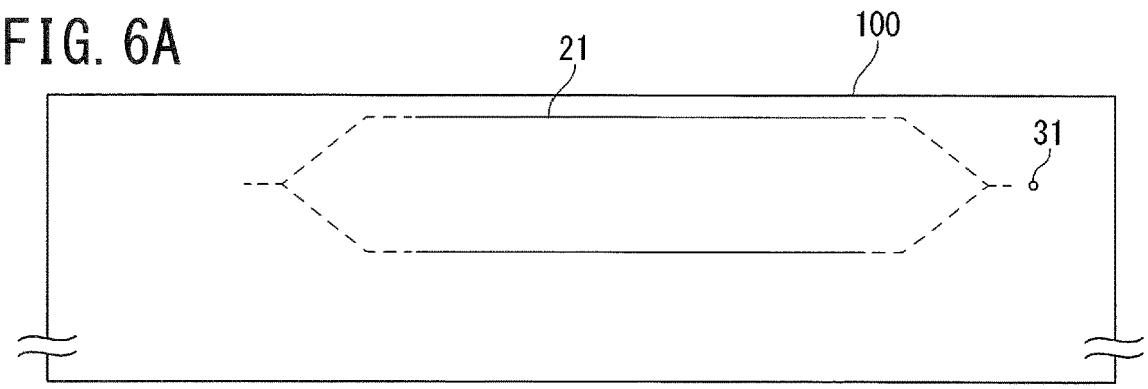
FIG. 6A is a block diagram (No. 1) schematically illustrating a method for manufacturing the insulating gate semiconductor device according to the embodiment of the present invention.

First, an insulating circuit board 100 for a generally available module is prepared. Next, on the insulating circuit board 100, a conductive film for a circuit pattern such as a copper foil, which is deposed in advance in a planned region in which the main-current path member 21 is to be arranged, is processed by etching or the like, and a predetermined wiring shape is patterned. As illustrated in FIG. 6A, the patterning of the wiring of the main-current path member 21 is implemented so that a planar pattern in which a linearly extending portion is included in the gate-current enhancing region A later is delineated.

Figure 6B:
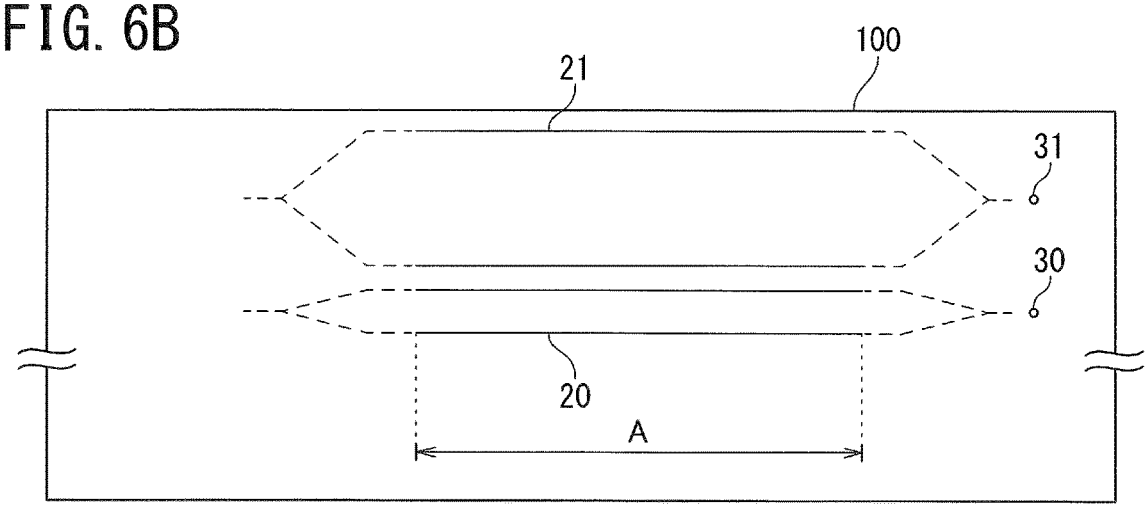
FIG. 6B is a block diagram (No. 2) schematically illustrating the method for manufacturing the insulating gate semiconductor device according to the embodiment of the present invention.

Next, the conductive film in the planned region in which the gate-current path member 20 is to be arranged on the insulating circuit board 100 is processed by etching or the like, and the wiring of the gate-current path member 20 is patterned. As illustrated in FIG. 6B, the patterning of the wiring of the gate-current path member 20 is implemented so that a planar pattern in which a linearly extending portion in parallel to the main-current path member 21 is included immediately in the vicinity of the wiring pattern of the linearly extending portion of the main-current path member 21, is delineated.

The patterning of the main-current path member 21 and the gate-current path member 20 is implemented so that a region linearly extending in parallel to each other is included at least partially in each linearly extending portion of the main-current path member 21 and the gate-current path member 20 in the gate-current enhancing region A. In addition, any one of the patterning of the main-current path member 21 and the patterning of the gate-current path member 20 may be implemented first, or both may be implemented at the same time.

Figure 6C:
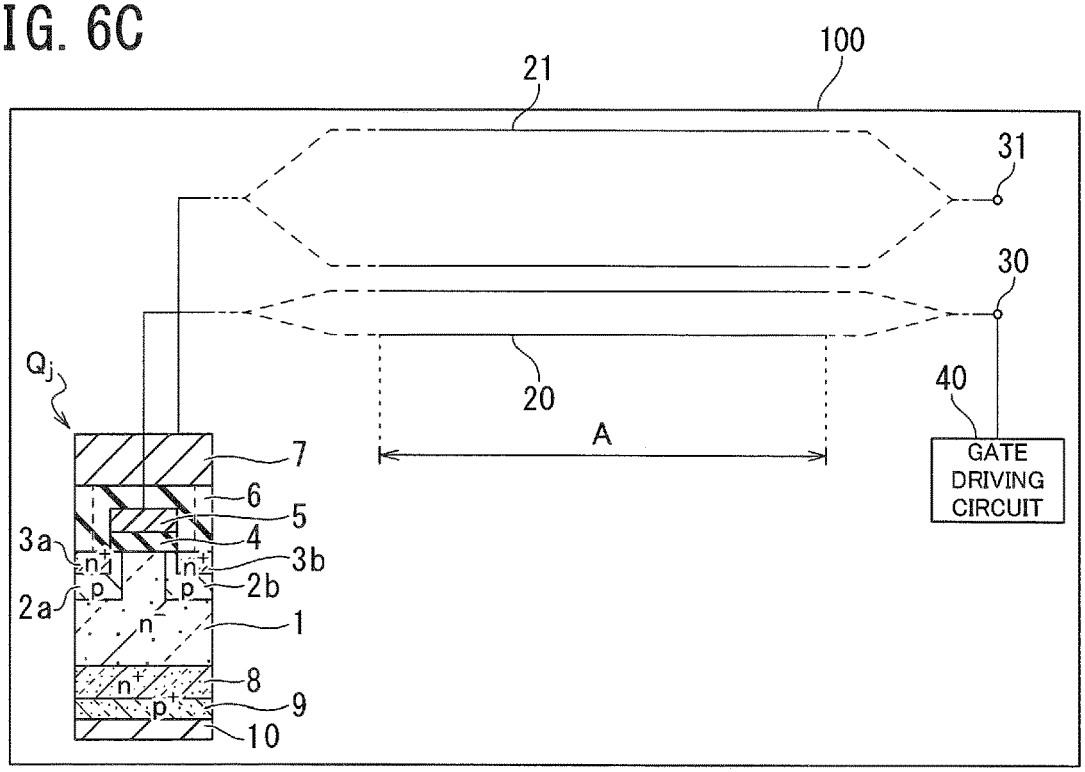
FIG. 6C is a block diagram (No. 3) schematically illustrating the method for manufacturing the insulating gate semiconductor device according to the embodiment of the present invention.

Next, wiring patterns other than the main-current path member 21 and the gate-current path member 20 are also delineated, and a circuit pattern is delineated on the insulating circuit board 100. Next, as illustrated in FIG. 6C, the semiconductor chips $Q_j$ are mounted at predetermined positions on the insulating circuit board 100 and connected and fixed by solder or the like. In addition, the mounted semiconductor chip $Q_j$ and the circuit pattern are electrically connected, and each of the circuit patterns are electrically connected, and the wiring patterns are electrically connected to each of the input/output terminal and the connection terminal, by wire bonding or the like. Finally, the insulating gate semiconductor device illustrated in FIG. 1 can be obtained as a semiconductor module.

Other Embodiments

The present invention has been described with reference to the above-mentioned embodiments. However, it will be understood that the description and the drawings forming a portion of the disclosure do not limit the present invention. It will be apparent to those skilled in the art that various modifications, embodiments, and application techniques of the present disclosure can be made.

Figure 7:
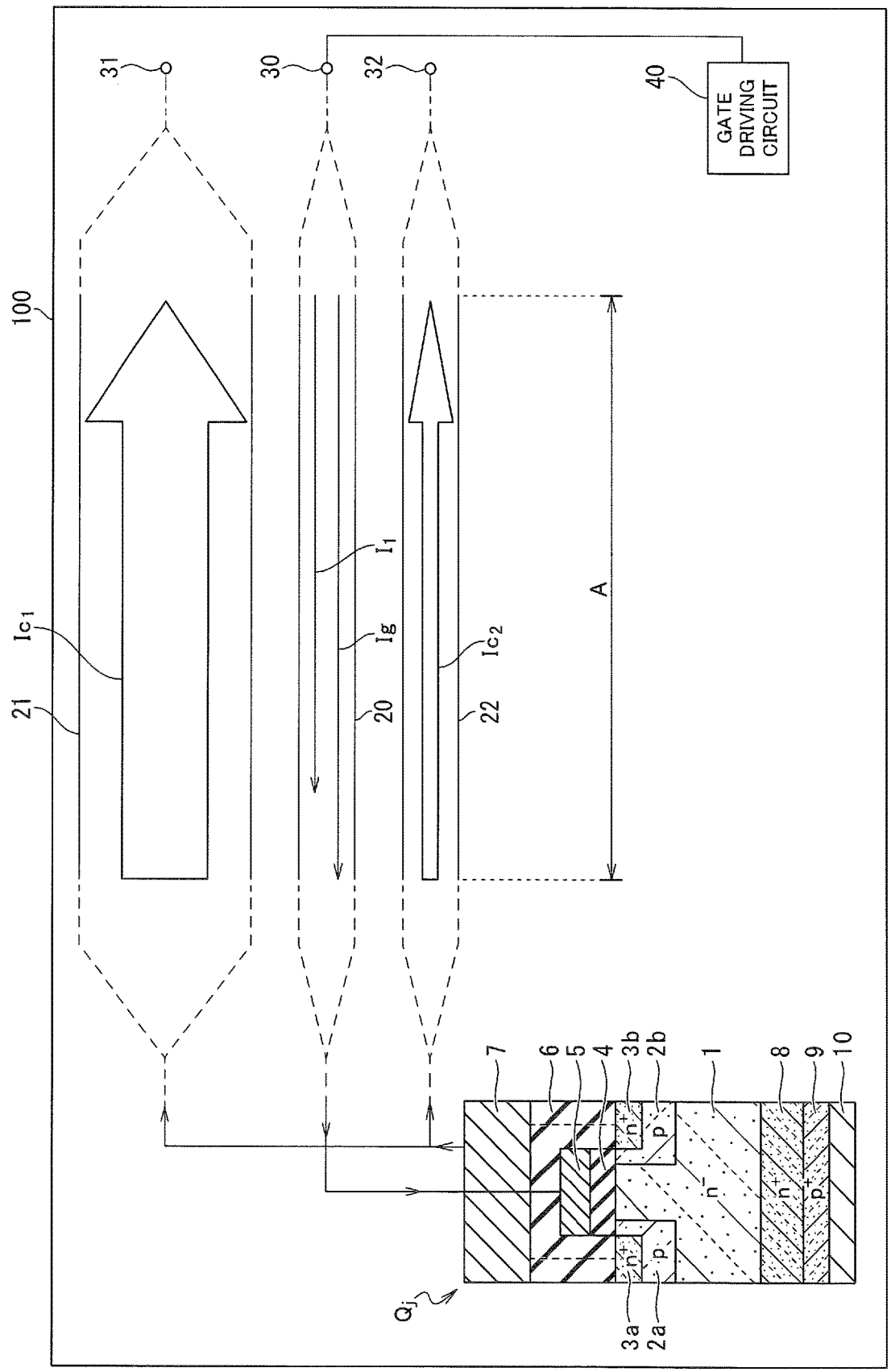
FIG. 7 is a block diagram including a cross-sectional diagram schematically illustrating an outline of a structure of an insulating gate semiconductor device according to another embodiment of the present invention.

For example, as illustrated in FIG. 7, together with the main-current path member 21 served as the first main-current path, the auxiliary main-current path member 22 served as the second main-current path may be provided so as to overlap with the gate-current enhancing region A. Similarly to the insulating gate semiconductor device illustrated in FIG. 1, the insulating gate semiconductor device illustrated in FIG. 7 includes a main-current path member 21 with a linearly extending portion and a gate-current path member 20 with a portion extending in parallel to the main-current path member 21 immediately in the vicinity of the main-current path member 21.

As illustrated in FIG. 7, the auxiliary main-current path member 22 is provided between the emitter electrode 7 and the first external terminal 32 which is provided outside the semiconductor chip $Q_j$, while being electrically connected to the emitter electrode 7 and the first external terminal 32. The auxiliary main-current path member 22 is linear and provided on the side of the gate-current path member 20 opposite to the main-current path member 21 in a planar pattern to be separated from and in parallel to the gate-current path member 20. That is, the auxiliary main-current path member 22 is located farther from the main-current path member 21 than from the gate-current path member 20 arranged immediately in the vicinity of the main-current path member 21.

In the insulating gate semiconductor device illustrated in FIG. 7, the gate-current path member 20 is arranged in parallel to the main-current path member 21 and immediately in the vicinity of the main-current path member 21, and the gate-current Ig can be greatly influenced by the operation of mutual induction caused by the change in the main-current Ic in the turn-on period, as well. Then, the gate-current Ig flowing in the direction opposite to the main-current Ic is enhanced by the induced current $I_1$, and the gate-current Ig and the induced current $I_1$ are transmitted to the gate electrode 5 as control signals, so that the turn-on operation becomes much faster than the turn-on operation in the related art.

As illustrated in FIG. 7, as long as the main-current path member 21 and the gate-current path member 20 are in parallel to each other and the main-current Ic and the gate-current Ig are in the opposite directions, another wiring pattern can be provided, and it is possible to obtain an insulating gate semiconductor device with further improved convenience.

In addition, in FIG. 1 to FIG. 7, a representative IGBT as an insulating gate semiconductor device of a power switching element has been described. However, the present invention is not limited to the IGBT, and various insulating gate semiconductor elements can be adopted. For example, the present invention may be applied to insulating gate field effect transistors such as MOSFETs and MISFETs, insulating gate static induction transistors such as MOSSITs and MISSITs, or other insulating gate semiconductor devices such as MOS gate static induction thyristors. In the case that MOSFETs, MISFETs, MOSSITs, MISSITs, or the like are adopted, the "first main electrode region" denotes a source region, and the "second main electrode region" denotes a drain region.

In addition, in the insulating gate semiconductor device according to the embodiment of the present invention, other circuit elements, such as diode chips for protection of a power switching element, may be mounted on the insulating circuit board 100. For example, a high-speed diode, which is FWD, may be connected in reversely parallel to the IGBT, or another circuit element such as a rectifier diode may be further incorporated.

In addition, the number of semiconductor chips is limited to one. In practice, the switching element can be implemented by using a plurality of semiconductor chips of which the number is required for the rating capacity of the power semiconductor device. Larger a current which the semiconductor device handles is, more prominent the effectiveness of the present invention is.

As described above, the present invention includes various embodiments etc. which have not been described above and the technical scope of the present invention is defined by only matters specifying the present invention described in the appropriate claims of the present invention.

What is claimed is:

1. An insulating gate semiconductor device comprising:
   an insulating gate semiconductor element, being a semiconductor chip, and having a first main electrode region and a second main electrode region;
   an insulating circuit board, having a first external terminal and a second external terminal provided in a periphery of the insulating circuit board, the semiconductor chip is mounted on the insulating circuit board;
   a main-current path member, being patterned so as to have a linearly extending portion in a planar pattern on the insulating circuit board, being provided to connect between the first external terminal and the first main electrode region, not to connect to the second main electrode region, and a main-current of the insulating gate semiconductor element flows toward the first external terminal in the main-current path member; and
   a gate-current path member, being patterned so as to have a linearly extending portion arranged in parallel to the linearly extending portion of the main-current path member in a planar pattern on the insulating circuit board, being provided to connect between the second external terminal and a gate electrode of the insulating gate semiconductor element, and a gate-current which controls the main-current flow in a direction opposite to the main-current in the portion arranged in parallel in the gate-current path member,
   wherein a current which is induced in the gate-current path member by mutual induction caused by a change in magnetic field implemented by the main-current is used for increasing the gate-current in a turn-on period of the insulating gate semiconductor element.

2. The insulating gate semiconductor device according to claim 1,
   wherein the gate-current path member and the main-current path member are provided adjacent to each other.

3. The insulating gate semiconductor device according to claim 1, further comprises:
   an auxiliary main-current path member provided on a side of the gate-current path member opposite to the main-current path member.

4. The insulating gate semiconductor device according to claim 1, wherein
   the semiconductor chip includes a drift region,
   the first main electrode region and the gate electrode are provided above the drift region,
   the second main electrode region is provided below the drift region, and the insulating gate semiconductor device further comprises:
- a first main electrode on a top surface of the semiconductor chip electrically connected to the first main electrode region, and
- a second main electrode on a bottom surface of the semiconductor chip electrically connected to the second main electrode region.

5. The insulating gate semiconductor device according to claim 1, wherein a feedback capacity is accumulated between the gate electrode and the second main electrode region.

6. The insulating gate semiconductor device according to claim 1, wherein
the first main electrode region is an emitter region or a source region, and
the second main electrode region is a collector region or a drain region.

7. The insulating gate semiconductor device according to claim 1, further comprising a gate driving circuit, connected to the second external terminal, to generate the gate-current as a control signal to control switching of an electrical conducting state of the main-current, and to transmit the gate-current to the gate electrode.

8. The insulating gate semiconductor device according to claim 1, wherein the current which is induced in the gate-current path member by mutual induction is aligned in a same direction as the gate-current such that the gate-current is increased by the current which is induced and the increased gate-current is transmitted into the gate electrode.

* * * * *